US009029739B2

(12) United States Patent
Ranish et al.

(10) Patent No.: US 9,029,739 B2
(45) Date of Patent: May 12, 2015

(54) APPARATUS AND METHODS FOR RAPID THERMAL PROCESSING

(71) Applicants: Applied Materials, Inc., Santa Clara, CA (US); Lawrence Livermore National Security, LLC, Livermore, CA (US)

(72) Inventors: Joseph M. Ranish, San Jose, CA (US); Aaron Muir Hunter, Santa Cruz, CA (US); Thomas F. Soules, Livermore, CA (US); Alexander M. Rubenchik, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 25 days.

(21) Appl. No.: 13/904,810

(22) Filed: May 29, 2013

(65) Prior Publication Data

US 2013/0323936 A1    Dec. 5, 2013

Related U.S. Application Data

(60) Provisional application No. 61/653,138, filed on May 30, 2012.

(51) Int. Cl.
*H01L 21/67* (2006.01)
*H01L 21/268* (2006.01)
(Continued)

(52) U.S. Cl.
CPC ............... *H05B 3/00* (2013.01); *H01L 21/268* (2013.01); *H01L 21/67115* (2013.01); *H01L 21/67248* (2013.01); *H01L 21/68792* (2013.01); *Y10S 148/09* (2013.01); *Y10S 148/093* (2013.01)

(58) Field of Classification Search
CPC ............. H01I 21/268; H01L 21/67115; H01L 21/67248; H05B 3/00

USPC ................... 438/795; 148/DIG. 90, DIG. 93; 219/438, 478, 536, 537, 538, 552, 553
See application file for complete search history.

(56) References Cited

U.S. PATENT DOCUMENTS

| 5,708,755 A | 1/1998 | Gronet et al. |
| 6,476,362 B1 | 11/2002 | Deacon et al. |

(Continued)

FOREIGN PATENT DOCUMENTS

| EP | 0872574 A2 | 10/1998 | |
| WO | WO 2007/096995 | * 8/2007 | ............... H01L 21/26 |
| WO | WO 2013/181263 | * 12/2013 | ............ H01L 21/324 |

OTHER PUBLICATIONS

PCT Notification of Transmittal of the International Search Report and the Written Opinion of the International Searching Authority, or the Declaration for PCT/US2013/043133; 9 pages; Aug. 27, 2013.

*Primary Examiner* — Mary Wilczewski
(74) *Attorney, Agent, or Firm* — Patterson & Sheridan, LLP

(57) ABSTRACT

Embodiments of the present invention provide apparatus and methods for performing rapid thermal processing. One embodiment of the present invention provides an apparatus for processing a substrate. The apparatus includes a heating source disposed outside a chamber body and configured to provide thermal energy towards a processing volume. The substrate support defines a substrate supporting plane, and the substrate support is configured to support the substrate in the substrate supporting plane. The heating source includes a frame member having an inner wall surrounding an area large enough to encompass a surface area of the substrate, and a plurality of diode laser tiles mounted on the inner wall of the frame member. Each of the plurality of diode laser tiles is directed towards a corresponding area in the processing volume.

20 Claims, 8 Drawing Sheets

(51) Int. Cl.
*H05B 3/00* (2006.01)
*H01L 21/687* (2006.01)

(56) References Cited

U.S. PATENT DOCUMENTS

| | | | | |
|---|---|---|---|---|
| 6,717,158 B1* | 4/2004 | Gat et al. | | 250/492.2 |
| 6,771,895 B2* | 8/2004 | Gat et al. | | 392/416 |
| 7,015,422 B2* | 3/2006 | Timans | | 219/390 |
| 7,038,174 B2* | 5/2006 | Gat et al. | | 219/390 |
| 7,269,343 B2* | 9/2007 | Koren et al. | | 392/416 |
| 7,551,818 B2 | 6/2009 | Okorogu | | |
| 7,608,802 B2* | 10/2009 | Gat et al. | | 219/390 |
| 7,616,872 B2* | 11/2009 | Camm et al. | | 392/416 |
| 7,838,431 B2* | 11/2010 | Sanchez | | 438/706 |
| 7,847,218 B2* | 12/2010 | Timans | | 219/390 |
| 7,949,237 B2* | 5/2011 | Koren et al. | | 392/416 |
| 7,977,258 B2* | 7/2011 | Nenyei et al. | | 438/795 |
| 7,985,945 B2* | 7/2011 | Koelmel et al. | | 219/409 |
| 8,138,451 B2* | 3/2012 | Gat et al. | | 219/390 |
| 8,222,574 B2* | 7/2012 | Sorabji et al. | | 219/444.1 |
| 8,452,166 B2* | 5/2013 | Ranish et al. | | 392/416 |
| 8,660,156 B2* | 2/2014 | Telford et al. | | 372/36 |
| 8,669,496 B2* | 3/2014 | Timans | | 219/390 |
| 8,761,587 B2* | 6/2014 | Ranish et al. | | 392/416 |
| 8,918,303 B2* | 12/2014 | Timans | | 702/99 |
| 2002/0005400 A1 | 1/2002 | Gat | | |
| 2006/0291833 A1* | 12/2006 | Timans | | 392/416 |
| 2008/0018729 A1 | 1/2008 | Hamada | | |
| 2008/0169282 A1* | 7/2008 | Sorabji et al. | | 219/444.1 |
| 2011/0043900 A1 | 2/2011 | Bayramian | | |
| 2011/0089166 A1* | 4/2011 | Hunter et al. | | 219/647 |
| 2011/0121503 A1* | 5/2011 | Burrows et al. | | 269/289 R |
| 2011/0222840 A1* | 9/2011 | Koren et al. | | 392/411 |
| 2011/0235669 A1 | 9/2011 | Deri et al. | | |
| 2011/0286483 A1 | 11/2011 | Deri et al. | | |
| 2013/0025325 A1* | 1/2013 | Piwczyk et al. | | 65/392 |
| 2013/0114632 A1* | 5/2013 | Telford | | 372/38.02 |
| 2013/0323936 A1* | 12/2013 | Ranish et al. | | 438/795 |
| 2014/0003800 A1* | 1/2014 | Ramamurthy et al. | | 392/416 |
| 2014/0220710 A1* | 8/2014 | Aderhold et al. | | 438/5 |
| 2014/0246422 A1* | 9/2014 | Koren et al. | | 219/494 |
| 2014/0255013 A1* | 9/2014 | Ranish et al. | | 392/411 |
| 2014/0270731 A1* | 9/2014 | Gerling et al. | | 392/408 |
| 2014/0319120 A1* | 10/2014 | Brillhart et al. | | 219/405 |
| 2014/0376897 A1* | 12/2014 | Ranish et al. | | 392/416 |

* cited by examiner

APPARATUS AND METHODS FOR RAPID THERMAL PROCESSING

CROSS-REFERENCE TO RELATED APPLICATIONS

This application claims benefit of U.S. Provisional Patent Application Ser. No. 61/653,138, filed May 30, 2012, which is herein incorporated by reference.

BACKGROUND OF THE INVENTION

1. Field

Embodiments of the present invention generally relate to apparatus and method for processing semiconductor substrates. Particularly, embodiments of the present invention relate to apparatus and methods for rapid thermal processing.

2. Description of the Related Art

Rapid thermal processing (RTP) is a process for annealing substrates during semiconductor processing. During RTP, a substrate is generally supported by a supporting device near the edge region and rotated as the substrate is heated by one or more heat sources. During RTP, thermal radiation is generally used to rapidly heat a substrate in a controlled environment to a maximum temperature of up to about 1350 degrees Celsius. Incandescent halogen lamps are often used as thermal radiation source during RTP. Incandescent halogen lamps are usually packed side by side in an array for generate high density and relatively uniform radiant power.

However, there are limitations in using incandescent lamps as radiant source for RTP. First, the density of the radiant energy generated by incandescent halogen lamps is limited by the density of packing which is inherently limited by the size of the halogen lamps. Second, the maximum temperature of the incandescent halogen lamps is also limited by the maximum temperature of the filament in each incandescent lamp. For example, the maximum temperature can be emitted by the filament of an incandescent lamp is less than about 3000 Kelvin (2730 degrees Celsius). Next, thermal inertia of the filaments in the incandescent lamps also limits the rates of temperature ramp up and ramp down, thus, limits throughput.

Furthermore, because incandescent lamps radiant in all redirections, it is difficult to control the amount of energy directed towards the substrate being processed. Additionally, the array of incandescent lamps generally covers the entire surface of the substrate during processing making it difficult to have a clear line of sight of the substrate for monitoring, such as measuring a substrate temperature with a pyrometer.

Therefore, there is a need for apparatus and methods for rapid thermal processing with improved radiant source.

SUMMARY

Embodiments of the present invention provide apparatus and methods for performing rapid thermal processing.

One embodiment of the present invention provides an apparatus for processing a substrate. The apparatus includes a chamber body defining a processing volume, a substrate support disposed in the processing volume, and a heating source disposed outside the chamber body and configured to provide thermal energy towards the processing volume. The substrate support defines a substrate supporting plane, and the substrate support is configured to support the substrate in the substrate supporting plane. The heating source includes a frame member having an inner wall surrounding an area large enough to encompass a surface area of the substrate, and a plurality of diode laser tiles mounted on the inner wall of the frame member. Each of the plurality of diode laser tiles is directed towards a corresponding area in the processing volume.

Another embodiment of the present invention provides a method for processing a substrate. The method includes placing a substrate on a substrate support disposed in a processing chamber and directing radiant energy a heating source towards a substrate through a window in the processing chamber. The heating source is disposed outside the processing chamber body. The heating source includes a frame member having an inner wall surrounding an area large enough to encompass a surface area of the substrate, and a plurality of diode laser tiles mounted on the inner wall of the frame member. Each of the plurality of diode laser tiles is directed towards a corresponding area in the surface area of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide apparatus and method for rapid thermal processing. Particularly, embodiments of the present invention provide apparatus and method for rapid thermal processing using a radiant energy source having laser diode tiles. According to one embodiment of the present invention, a heating source including a plurality of laser diode tiles is used to provide thermal energy during thermal processing. The plurality of laser diode tiles are mounted on an inner wall of a frame member. Each laser diode tile may be adjusted to direct energy towards a certain area in the processing chamber.

Figure 1:
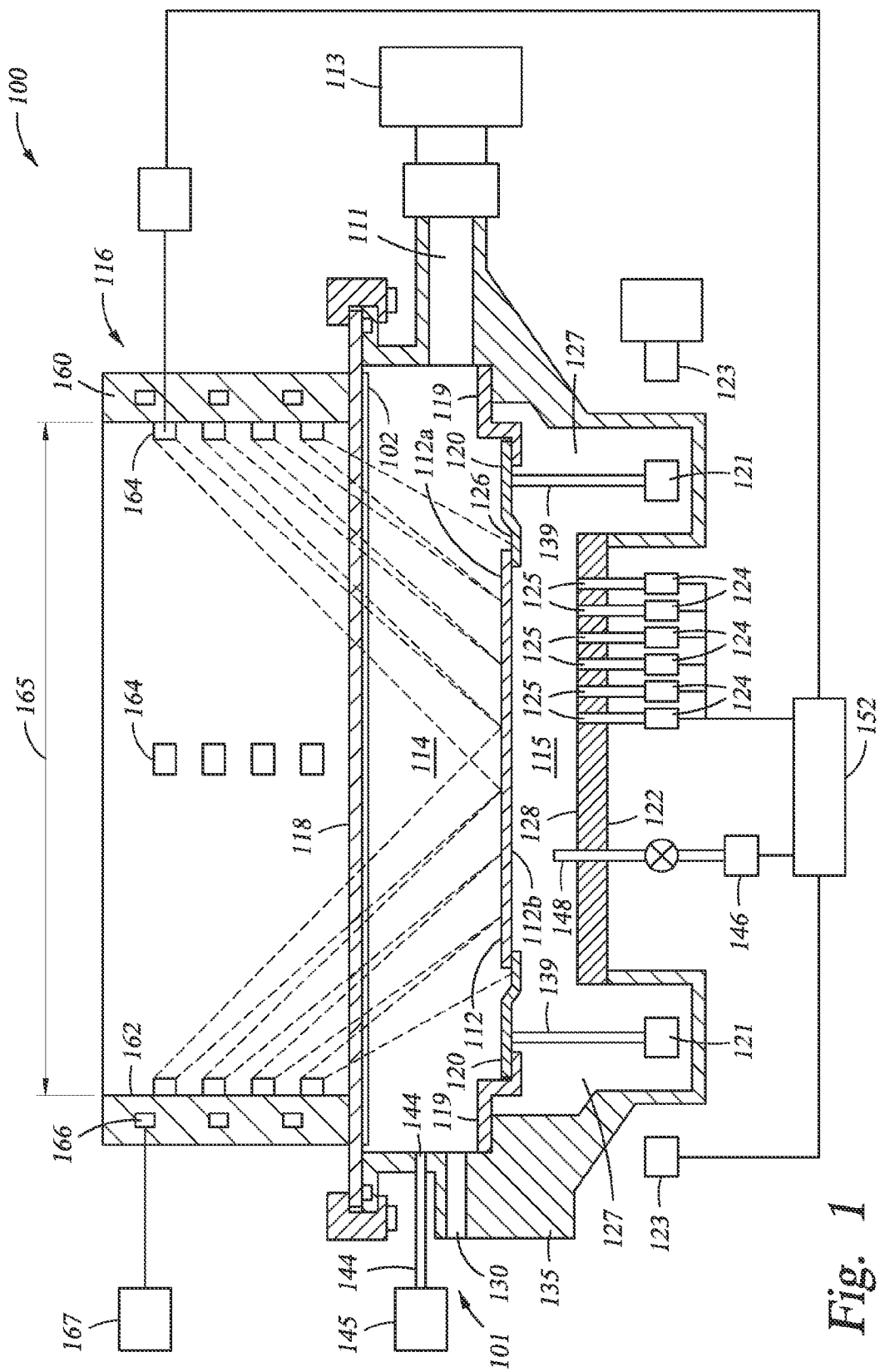
FIG. 1 is a schematic sectional view of a processing chamber according to one embodiment of the present invention.

FIG. 1 schematically illustrates a sectional view of a rapid thermal processing system 100 in accordance with one embodiment of the present invention. The rapid thermal processing system 100 comprises a chamber housing assembly 101 defining a processing volume 114 configured for processing a substrate 112 therein. The substrate 112 may be a disk-shaped substrate. The chamber housing assembly 101 may include chamber walls 135, a window 118 configured to allow thermal energy therein and a reflector plate 122 opposing the window 118. A heating source 116 is disposed outside the window 118. The heating source 116 is configured to heat the processing volume 114 with radiant energy through the window 118.

A slit valve 130 may be formed on a side of the chamber walls 135 providing a passage for the substrate 112 to the processing volume 114. A gas inlet 144 may be connected to a gas source 145 to provide processing gases, purge gases and/or cleaning gases to the processing volume 114. A vacuum pump 113 may be fluidly connected to the processing volume 114 through an outlet 111 for pumping out the processing volume 114.

In one embodiment, an edge ring 120 may be disposed in the processing volume 114 to support the substrate 112 by a peripheral edge. The edge ring 120 has a substrate supporting plane 126 on which the substrate 112 is positioned. The edge ring 120 may be disposed on a tubular riser 139. The tubular riser 139 rests on or otherwise coupled to a magnetic rotor 121 disposed in a circular channel 127 within the chamber walls 135. A magnetic stator 123 disposed outside the chamber walls 135 is magnetically coupled to the magnetic rotor 121 through the chamber walls 135. The magnetic stator 123 may induce rotation of the magnetic rotor 121 and hence of rotation of the edge ring 120 and the substrate 112 supported thereon. The magnetic stator 123 may be also configured to adjust the elevations of the magnetic rotor 121, thus lifting the edge ring 120 and the substrate 112 being processed. It should be noted that other suitable substrate support may be used in place of the edge ring 120 and the tubular riser 139 for supporting and rotating a substrate.

In one embodiment, an outer ring 119 may be coupled between the chamber wall 135 and the edge ring 120 to separate a reflective cavity 115 from the processing volume 114. The reflective cavity 115 and the processing volume 114 may have different environments.

The reflector plate 122 and the window 118 are positioned on opposite sides of the substrate 112. A front side 112a of the substrate 112 faces the window 118 and the heating source 116. A backs side 112b of the substrate 112 faces the reflector plate 122. The reflector plate 122 has an optical reflective surface 128 facing the back side 112b of the substrate 112 to enhance the emissivity of the substrate 112 by reflecting radiant energy from the substrate 112 back to the substrate. In one embodiment, the reflector plate 122 may be water cooled. In one embodiment, the reflector plate 122 has a diameter slightly larger than the diameter of the substrate 112 being processed. A plurality of apertures 125 may be formed through the reflector plate 122. A plurality of temperature sensors 124 may be used to measure temperature of the substrate 112 through the plurality of apertures 125.

A purge gas may be provided to the reflective cavity 115 between the reflector plate 122 and the substrate 112 through a purge gas inlet 148. A purge gas source 146 may be connected to the purge gas inlet 148. The purge gas may be used to help conductively couple the substrate 112 with the reflector plate 122 to increase cool down rates. The purge gas may also be distributed to help purge tips of the temperature sensors 124 to prevent or reduce deposit formation on the temperature sensors 124.

The heating source 116 is positioned outside the window 118 and configured to direct radiant energy through the window 118 towards the substrate 112 in the processing volume 114. As shown in FIG. 1, the window 118 is disposed over the chamber walls 135 and the heating source 116 is positioned above the window 118 for heating the substrate 112 at the front side 112a. However, the window 118 may be positioned below the chamber walls 135 and the heating source 116 is positioned below the window 118 for heating the substrate 112 at the back side 112b. The substrate 112 may be processed facing up with the front side 112a being the device side. Alternatively, the substrate may be processed facing down with the back side 112b being the device side.

The heating source 116 includes a frame member 160 disposed over the window 118. The frame member 160 has an inner wall 162. The inner wall 162 encloses an inner area 165. The inner area 165 is large enough to encompass the surface area of the substrate 112. In one embodiment, the inner wall 162 substantially perpendicular to the substrate supporting plane 126. In one embodiment, the frame member 160 is a short pipe and the inner wall 162 is cylindrical and an inner diameter of the inner wall 162 is at least as large as the diameter of the substrate 112 being processed.

A plurality of laser diode tiles 164 are mounted on the inner wall 162 of the frame member 160. Each of the plurality of laser diode tiles 164 is configured to direct radiant energy towards a corresponding area on the substrate 112 through the window 118. The plurality of laser diode tiles 164 are mounted in different locations on the inner wall 162 and may be tilted at different angles to cover different areas. Each laser diode tile 164 is amounted so that the corresponding heated area on the substrate receives is irradiated at a more oblique angle. In one embodiment, the combination of heating areas of the plurality of laser diode tiles 164 covers the entire surface area of the substrate 112 being processed. Therefore, the entire surface of the substrate 112 may be heated by the plurality of laser diode tiles 164 without scanning. In one embodiment, the substrate 112 may be rotated rapidly during thermal processing to improve heating uniformity. In one embodiment, each laser diode tile 164 may be individually controlled to produce a desired amount of radiation. The substrate 112 may be heated at uniform or any desired patterns by adjusting the power level of the plurality of laser diode tiles 164 individually and/or by group.

The window 118 may be formed from a material substantially transparent to wavelength in the range of emitted by the laser diode tiles 164. In one embodiment, the window 118 is fabricated from quartz, e.g. amorphous silica. In one embodiment, the window 118 may include a coating 102. The coating 102 is configured to transmit radiation from the laser diode tiles 164 and reduce reflection loss from the laser diode tiles 164. Additionally, the coating 102 may be designed to reflect all gray-body emanation from the substrate 112, thus, improve heating efficiency. In one embodiment, the coating 102 may be a broad band reflective coating having an integral anti-reflective coating tailored for a range of incident angles to the substrate surface 112a from the plurality of laser diode tiles 164 and a range of wavelengths of the plurality of laser diode tiles 154.

In one embodiment, the frame member 160 may be cooled. The frame member 160 may have cooling channels 166 and cooled by a cooling fluid from a cooling fluid source 167. In one embodiment, the window 118 may be also be cooled.

According to one embodiment of the present invention, the window 118 and/or other components inside the rapid thermal processing chamber 100 facing the substrate 112 may be designed to absorb radiation from the substrate 112. For example, a coating configured to absorb gray-body radiation may be applied the inner surface of the rapid thermal processing system 100. After rapid heating, the substrate 112 is exposed to or may be positioned to radiation absorbing chamber components to achieve rapid temperature ramp down.

Figure 2A:
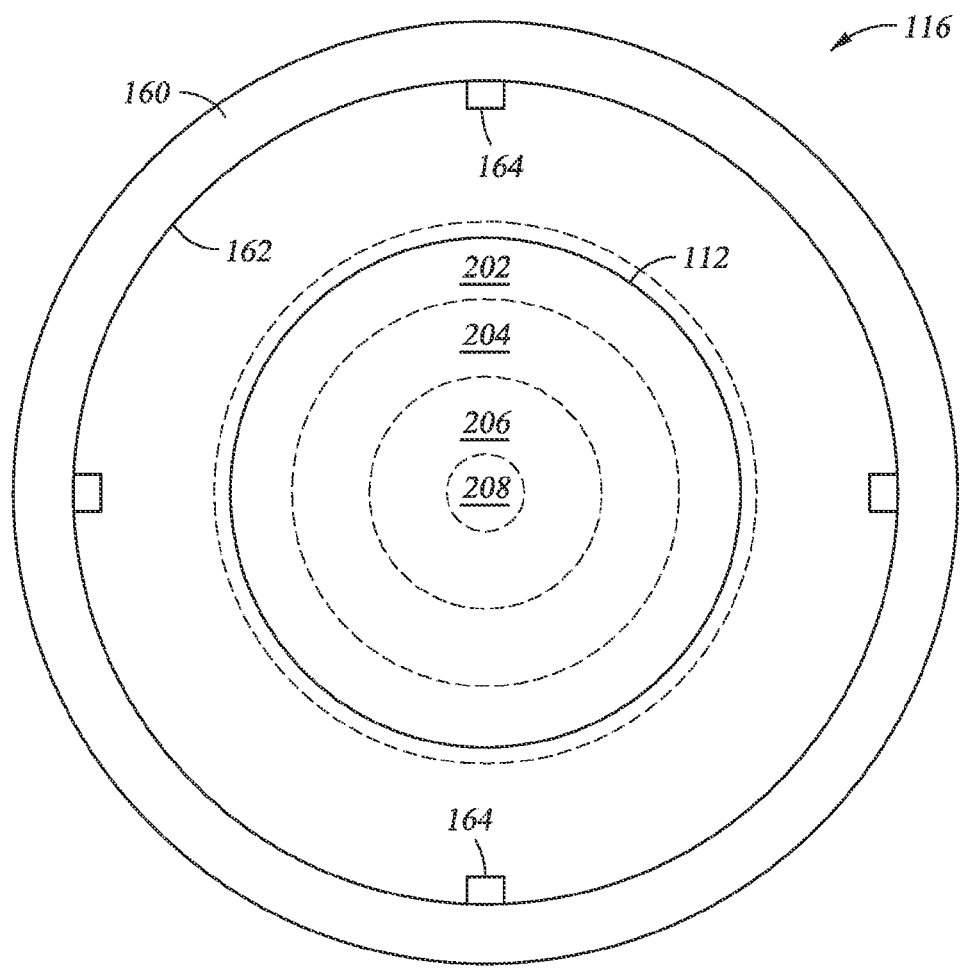
FIG. 2A is a schematic top view of a heating source according to one embodiment of the present invention.
Figure 2B:
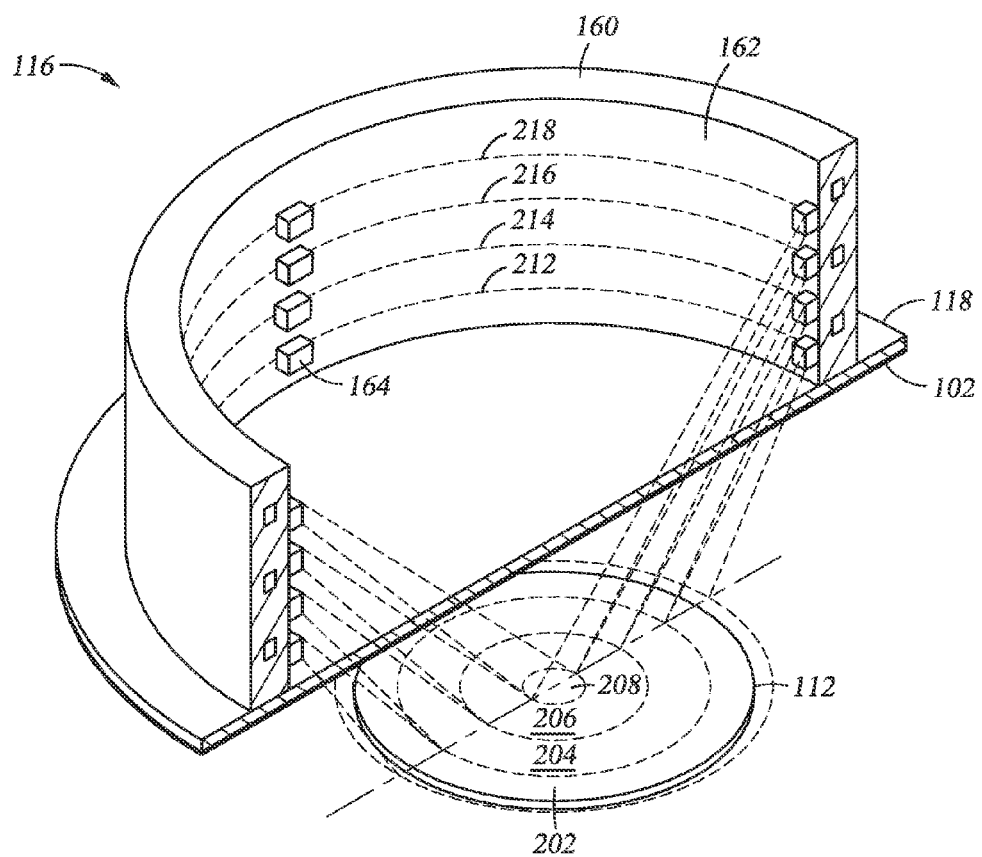
FIG. 2B is a schematic perspective sectional view of the heating source of FIG. 2A.

FIG. 2A is a schematic top view of the heating source 116 and FIG. 2B is a schematic perspective sectional view of the heating source 116. In one embodiment, the plurality of laser diode tiles 164 are arranged to form a plurality of heating zones to improve uniformity and control. As shown in FIGS. 2A and 2B, the plurality of laser diode tiles 164 may be arranged in a plurality of vertical levels 212, 214, 216, 218. The laser diode tiles 164 in the same vertical level are directed to the same heating zone. In one embodiment, the plurality of laser diodes 164 form a plurality of concentric heating zones 202, 204, 206, 208.

As shown in FIG. 2B, the plurality of laser diode tiles 164 in a lowest vertical level 212 direct radiant energy towards the outermost heating zone 202, the plurality of laser diode tiles 164 in the level 214 immediately above the lowest level 212 are directed to the heating zone 204 immediately inward from the outer most heating zone 202. The laser diode tiles 164 in the upper most level 218 covers the center heating zone 208. Neighboring heating zones may be slightly overlapped to make sure that the entire surface of the substrate 112 is covered. Even though four levels and four columns are shown in FIGS. 2A-2B, more or less levels and/columns of the laser diode tiles 164 may be arranged in the heating source 116 to satisfy the heating requirement.

In one embodiment, the plurality of laser diode tiles 164 may be arranged in a plurality of vertical columns along a circumference of the inner wall 162. The plurality of vertical columns may be evenly distributed along the circumference of the inner wall 162.

Figure 2C:
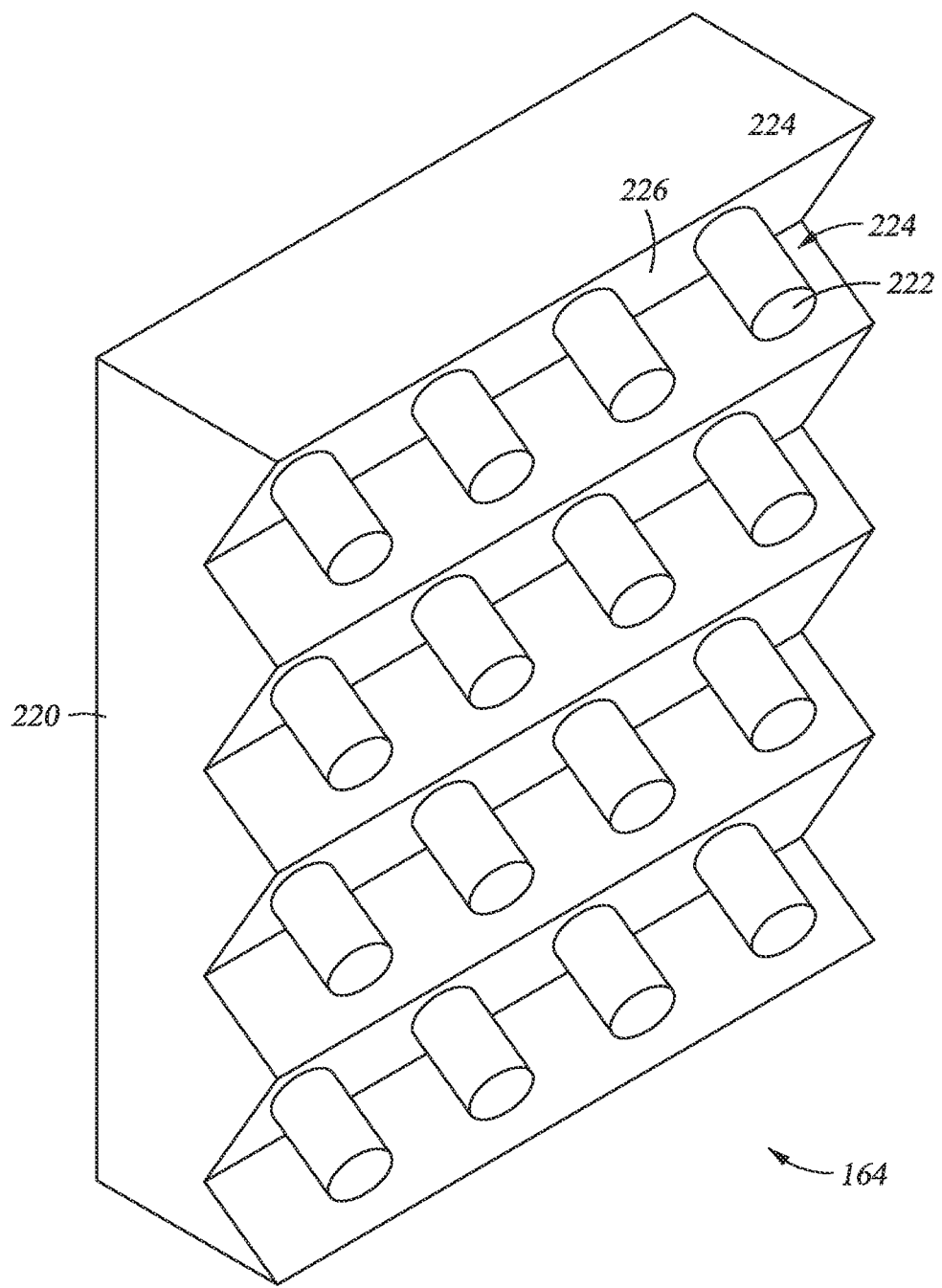
FIG. 2C is a schematic perspective view of a laser diode tile according to one embodiment of the present invention.

FIG. 2C is schematic perspective view of the laser diode tile 164 according to one embodiment of the present invention. The laser diode tile 164 may include a substrate 220 and an array of laser diodes 222 mounted on the substrate 220 configured to emit radiant energy. In one embodiment, the laser diodes 222 may be in the form of a plurality of laser diode bars 224. Each laser diode bar 224 may have a plurality of individual laser diode 222 along its length. The plurality of laser diode bars 224 may be parallel mounted on the substrate 220. In one embodiment, a plurality of angled steps 226 may be formed on the substrate 220 so that the laser diodes 222 are amounted in an angle relative to a major plane of the substrate 220. Even though FIG. 2C schematically shows five laser diode bars 224 and each laser diode bar 224 includes four laser diodes 222, the laser diode tile 164 of the present invention may include more or less laser diode bars 224 and each laser diode bars 224 may include more or less individual laser diodes 222. In one embodiment, the laser diode tile 164 may include about 10 to 15 laser diode bars 224. The laser diode bar 224 may be about 1 mm by 10 mm in dimension. Each laser diode bar 224 may include about 30 to 50 individual laser diodes 222. In one embodiment, each laser diode bar 224 may include a micro-lens, for example, a cylindrical micro-lens, to adjust radiation pattern of the laser diode bar 224.

In one embodiment, the laser diodes 222 may comprise Gallium Arsenide (GaAs). For example, the laser diode 222 may be a laser diode comprising epitaxial layers of indium-Gallium-Aluminum-Arsenide-phosphide (InGaAlAsP) grown on a Gallium-Arsenide (GaAs) substrate. The Gallium-Arsenide containing laser diode 224 may emit heat in a wavelength range between about 800 nm and about 900 nm. The laser diode tile 164 may radiate as much as 1 kW of power.

In one embodiment, the radiant energy from the laser diode 222 may be polarized and oriented to further increase absorption rate by the substrate 112 being treated. Typically the radiation emanating from a laser diode is polarized. Index guided diodes typically have a polarization ratio between 50:1 and 100:1. For wide stripe diodes, the polarization ratio is typically 30:1 or greater. Polarization of a laser diode has the E field oriented parallel to the slow axis of the laser diode. When the slow axis is arranged perpendicular to the surface being radiated, the laser diode is in "p" polarization (relative to the surface). In one embodiment, the angle between the slow axis of the laser diode 222 and the surface being radiate, such as a surface of the window 118 or the front side 112a of the substrate 112, is set about equal to Brewster's angle to maximize the absorption and minimize the reflection. Brewster's angle or polarization angle refers to an angle of incidence at which light with a particular polarization is perfectly transmitted through a transparent dielectric surface, with no reflection.

Figure 3:
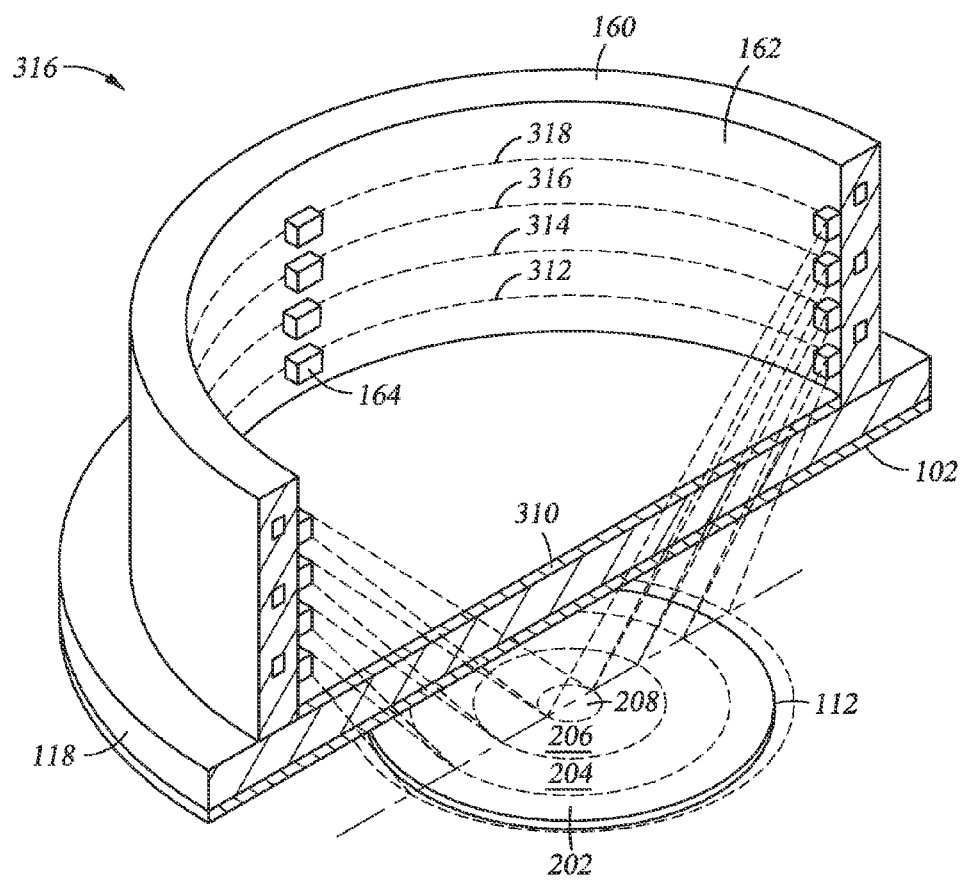
FIG. 3 is a perspective sectional view of a radiant source according to one embodiment of the present invention.

FIG. 3 is a perspective sectional view of a heating source 316 according to one embodiment of the present invention. The heating source 316 is similar to the heating source 116 of FIG. 2A except the heating source 316 includes a radiation homogenizing element 310 positioned between the plurality of laser diode tiles 164 and the substrate 112 being processed. The radiation homogenizing element 310 is configured to increase uniformity of radiation produced by the laser diode titles 164. The radiation homogenizing element 310 may be one of stipplings, dimples, mixers, multiple lens-lets (fly eyes), holographic or conventional diffusers, or any suitable optical devices. In one embodiment, the radiation homogenizing element 310 is an individual element as shown in FIG. 3. Alternatively, a radiation homogenizing element may be integrated in the window 118.

Figure 4:
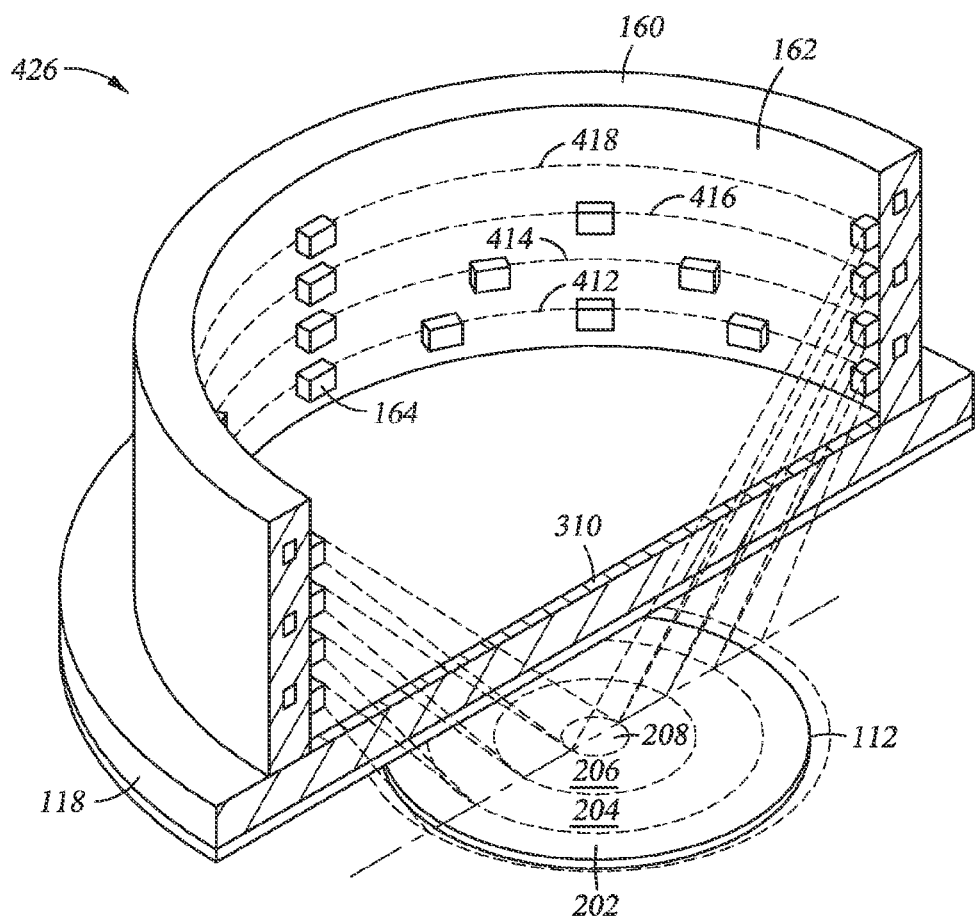
FIG. 4 is a perspective sectional view of a radiant source according to another embodiment of the present invention.

FIG. 4 is a perspective sectional view of a heating source 426 according to another embodiment of the present invention. The heating source 426 is similar to the heating source 116 of FIG. 2A-2B except the number of laser diode tiles 164 in each heating zone various. As shown in FIG. 4, the number of laser diode tiles 164 decreases from level 412 through levels 414, 416 to level 418. Because the inner heating zone 208 is smaller than the outer heating zone 202, fewer laser diode tiles 164 are used to heat the heating zone 208 than those used to heat the heating zone 202.

Figure 5A:
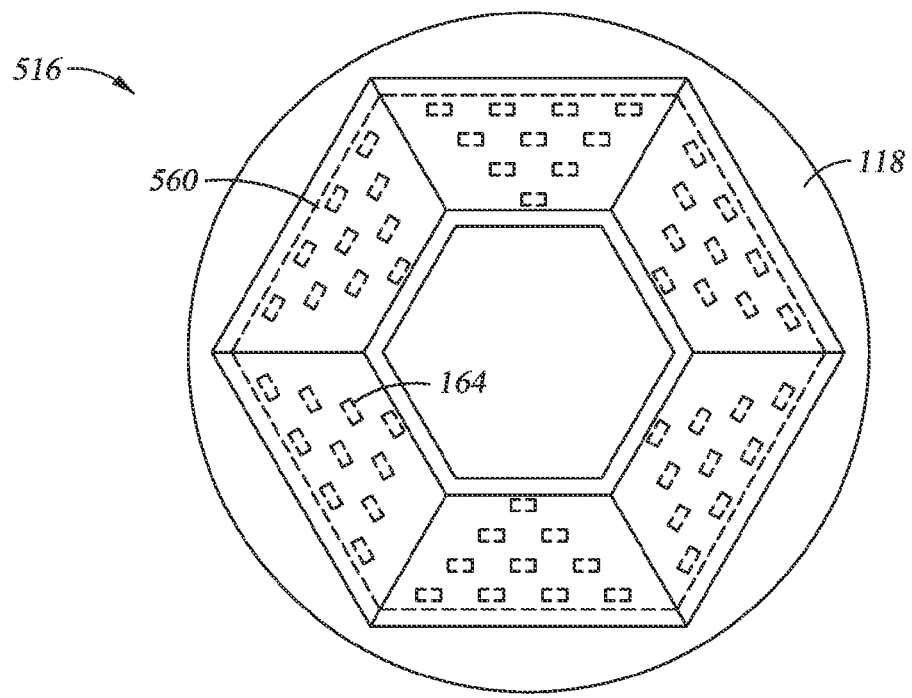
FIG. 5A is a schematic top view of a radiant source according to another embodiment of the present invention.
Figure 5B:
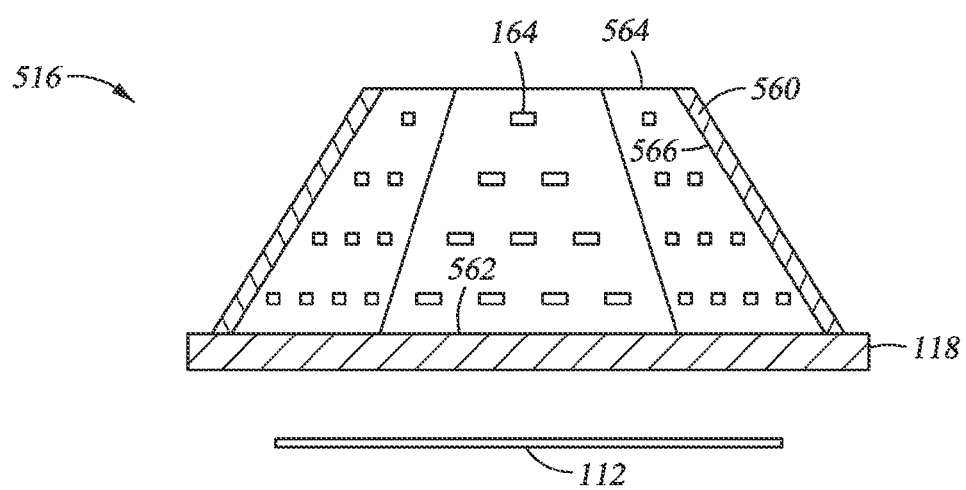
FIG. 5B is a schematic sectional view of the radiant source of FIG. 5A.

In an alternative embodiment, the laser diode tiles may be mounted inside a hollow multi-sided prism. FIG. 5A is a schematic top view of a radiant source 516 having the plurality of laser diode tiles 164 mounted on a multi-sided hollow prism 560. FIG. 5B is a schematic sectional view of the radiant source 516. Similar to the radiant sources 116, 316 and 426 described above, the radiant source 516 is disposed above the window 118 to supply radiant energy towards the substrate 112 disposed under the window 118 inside a processing chamber. The hollow multi-sided prism 560 may be tapered in shape having a large end 562 facing the window 118 and a smaller end 564 away from the window 118. The plurality of laser diode tiles 164 may be mounted on inner walls 566 of the multi-sided prism 560. The plurality of laser diode tiles 164 may be arranged in various patterns as described above to achieve desired processing effect.

Figure 6:
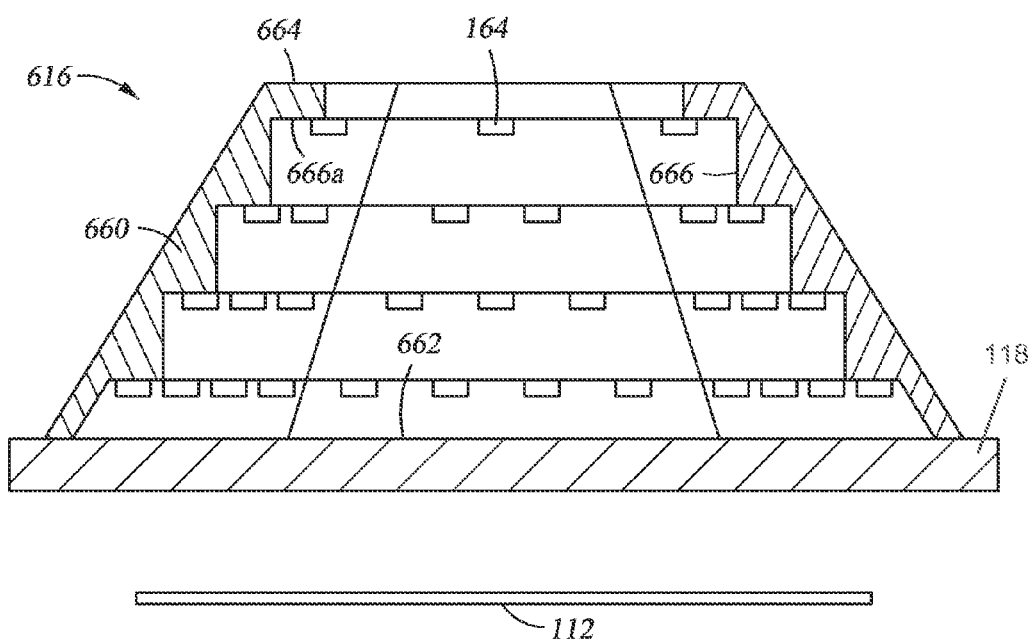
FIG. 6 is a schematic sectional view of a radiant source according to another embodiment of the present invention.

FIG. 6 is a schematic sectional view of a radiant source 616 according to another embodiment of the present invention. Similar to the radiant source 516, the radiant source 616 having the plurality of laser diode tiles 164 mounted on a hollow multi-sided prism 660. The radiant source 616 is disposed above the window 118 to supply radiant energy towards the substrate 112 disposed under the window 118 inside a processing chamber. The hollow multi-sided prism 660 may be tapered in shape having a large end 662 facing the window 118 and a smaller end 664 away from the window 118. The hollow-side prism 660 has terraced inner walls 666 for receiving the plurality of laser diode tiles 164. In one embodiment, the inner walls 666 may include horizontal portions 666a for receiving the plurality of laser diode tiles 164. The horizontal portions 666a allow radiation from the laser diode tiles 164 to be directed perpendicular to the substrate 112 for maximum efficiency.

Even though six sided prisms are shown in FIGS. 5A-5B and FIG. 6, prisms of different shape and design may be used for supporting the plurality of laser diode tiles 164.

Embodiments of the present invention provide various advantages over methods and apparatus for rapid thermal processing using traditional heating sources. First, more rapid heating may be achieved because the number of laser diode tiles may be easily increased without the geometrical limitation of traditional heating sources. Second, thermal profile of a substrate being processed can be more readily controlled because individual laser diode tile and/or group of laser diode tiles may be controlled separately and overlapping radiation from individual or group of laser diode tiles may be controlled through spacing, lensing or by diffusing. Third, heating efficiency can be greatly increased because the laser diodes emit radiation within the wavelength range that is more absorbable by silicon substrates than traditional radiation sources. Fourth, radiative losses are kept minimal because embodiments of the present invention include features for trapping gray-body radiation from the substrate being heated. Fifth, embodiments of the present invention increase device response time because laser diodes can be turned on and off almost instantaneously while traditional heating sources require a few tenths of a second the heat up and cool down. Sixth, the narrow ranges of incidence angles and wavelengths for radiation sources, i.e. laser diodes, make it easier to achieve a robust high efficiency anti-reflection film on the window.

Furthermore, the open top design of the heating source also enables a plurality of new functions or convenience. For example, the substrate being processed can be measured/monitor from both the reflector side and the heater side through the window 118. A second laser may be disposed right over the window 118 for pattern writing on the substrate. A gas injection nozzle can be positioned over the substrate for other processes, such as chemical vapor deposition during RTP. A white light may be used to illuminate the substrate through the window 118 to monitor the process or perform inspection of the substrate.

Even though heating sources are disposed above the substrate being processed in the examples described above, the heating sources according to embodiments of the present invention may be readily placed under a processing chamber for heating a substrate from underneath.

Even though embodiments of the present invention are discussed in association with rapid thermal processing, embodiments of the present invention may be used in apparatus and methods for any suitable processes, such as annealing, thermal deposition, chemical vapor deposition, oxidation, nitridation, etching, dopant activation, controlled surface reactions.

While the foregoing is directed to embodiments of the present invention, other and further embodiments of the invention may be devised without departing from the basic scope thereof, and the scope thereof is determined by the claims that follow.

The invention claimed is:

1. An apparatus for processing a substrate, comprising:
a chamber body defining a processing volume;
a substrate support disposed in the processing volume, wherein the substrate support defines a substrate supporting plane, and the substrate support is configured to support the substrate in the substrate supporting plane; and
a heating source disposed outside the chamber body and configured to provide thermal energy towards the processing volume, wherein the heating source comprises:
a frame member having an inner wall surrounding an area large enough to encompass a surface area of the substrate; and
a plurality of diode laser tiles mounted on the inner wall of the frame member, wherein each of the plurality of diode laser tiles is directed towards a corresponding area in the processing volume.

2. The apparatus of claim 1, wherein the inner wall is substantially perpendicular to the substrate supporting plane.

3. The apparatus of claim 2, wherein the inner wall is substantially cylindrical, and the plurality of diode laser tiles are distributed along a circumference of the inner wall, and the plurality of diode laser tiles are arranged in a plurality of levels.

4. The apparatus of claim 3, wherein the plurality of diode laser tiles are tilted towards the corresponding area in the processing volume.

5. The apparatus of claim 1, wherein the chamber body comprises a window fabricated from materials substantially transparent to radiant energy at a spectrum including wavelengths of emitting radiation of the plurality of diode laser bars, and the heating source is disposed outside the window so that radiant energy from the plurality of laser diode tiles reaches the substrate disposed on the substrate support.

6. The apparatus of claim 5, wherein the window is fabricated from quartz.

7. The apparatus of claim 5, wherein the window comprises a broad band reflective coating having an integral anti-reflective coating tailored for a range of incident angles to the substrate surface from the plurality of laser diode tiles and a range of wavelengths of the plurality of laser diode tiles.

8. The apparatus of claim 5, wherein the window has homogenizing features, such as stipplings, dimples, mixers, multiple lens-lets, holographic diffuser or conventional diffusers.

9. The apparatus of claim 5, further comprising a radiation homogenizing element disposed over the window, wherein the radiation homogenizing element includes one of stipplings, dimples, mixers, multiple lens-lets, holographic diffuser or conventional diffusers.

10. The apparatus of claim 5, wherein the window is positioned above the substrate support and the heating source is disposed over the window.

11. The apparatus of claim 5, wherein the window is positioned below the substrate support and the heating source is disposed underneath the window.

12. The apparatus of claim 1, wherein the frame member is a multiple-sided hollow prism, and the plurality of laser diode tiles are amounted on the inner walls of the multiple-sided hollow prism.

13. The apparatus of claim 12, wherein the inner wall of the multiple-sided hollow prism is tapered or terraced to support the plurality of laser diode tiles.

14. The apparatus of claim 1, wherein the plurality of laser diode tiles are oriented to achieve maximal absorption by the substrate disposed therein.

15. The apparatus of claim 5, further comprising a reflector, wherein the reflector and the window are disposed on opposite sides of the substrate supporting plane.

16. The apparatus of claim 15, wherein the reflector and window comprise radiation absorbing means configured to rapidly lower temperature of the substrate.

17. The apparatus of claim 4, wherein the laser diode tiles in plurality of levels form a plurality of concentric heating zones.

18. The apparatus of claim 17, wherein the number of laser diode tiles in plurality of concentric heating zones increases from inner zones to outer zones.

19. A method for processing a substrate, comprising:
   placing a substrate on a substrate support disposed in a processing chamber; and
   directing radiant energy from a heating source towards the substrate through a window in the processing chamber, wherein the heating source is disposed outside the processing chamber, and the heating source comprises:
      a frame member having an inner wall surrounding an area large enough to encompass a surface area of the substrate; and
      a plurality of diode laser tiles mounted on the inner wall of the frame member, wherein each of the plurality of diode laser tiles is directed towards a corresponding area in the surface area of the substrate.

20. The method of 19, further comprising:
   homogenizing radiant energy from the plurality of laser diode tiles.

* * * * *